United States Patent [19]
Atkins et al.

[11] Patent Number: 6,049,977
[45] Date of Patent: Apr. 18, 2000

[54] METHOD OF FORMING ELECTRICALLY CONDUCTIVE PILLARS

[75] Inventors: Glen G. Atkins; Michael S. Cohen, both of Boise; Karl H. Mauritz, Eagle; James M. Shaffer, Boise, all of Id.

[73] Assignee: Micron Technology, Inc., Boise, Id.

[21] Appl. No.: 08/856,991

[22] Filed: May 15, 1997

Related U.S. Application Data

[63] Continuation of application No. 08/108,097, Aug. 27, 1993, Pat. No. 5,570,032.

[51] Int. Cl.[7] ............................................ H01R 9/09
[52] U.S. Cl. .............................. 29/843; 29/846; 29/847
[58] Field of Search .............................. 29/846, 847, 843

[56] References Cited

U.S. PATENT DOCUMENTS

| | | |
|---|---|---|
| 3,963,985 | 6/1976 | Geldermans . |
| 3,969,816 | 7/1976 | Swengel, Sr. et al. .................... 29/879 |
| 4,899,107 | 2/1990 | Corbett et al. . |
| 4,914,814 | 4/1990 | Behun et al. .............................. 29/843 |
| 4,968,931 | 11/1990 | Littlebury et al. . |
| 5,010,296 | 4/1991 | Okada et al. . |
| 5,034,685 | 7/1991 | Leedy . |
| 5,034,688 | 7/1991 | Moulene et al. . |
| 5,047,711 | 9/1991 | Smith et al. . |
| 5,060,370 | 10/1991 | Seals, Jr. et al. ......................... 29/846 |
| 5,099,090 | 3/1992 | Allan et al. ........................... 29/846 X |
| 5,123,850 | 6/1992 | Elder et al. . |
| 5,198,752 | 3/1993 | Miyata et al. . |
| 5,198,753 | 3/1993 | Hambergen . |
| 5,210,485 | 5/1993 | Kreiger et al. . |
| 5,302,891 | 4/1994 | Wood et al. . |
| 5,325,052 | 6/1994 | Yamashita . |
| 5,342,807 | 8/1994 | Kinsman et al. . |
| 5,743,009 | 4/1998 | Matsui et al. .............................. 29/843 |
| 5,745,986 | 5/1998 | Variot et al. ........................... 29/843 X |

*Primary Examiner*—Lee Young
*Assistant Examiner*—Rick Kiltae Chang
*Attorney, Agent, or Firm*—Trask, Britt & Rossa

[57] ABSTRACT

A method of forming electrically conductive pillars on a printed circuit board by providing a printed circuit board having a plurality of electrical traces and forming a plurality of elongate, electrically conductive pillars of superimposed layers of solder and conductive polymer on the printed circuit board. The elongate, electrically conductive pillars are connected by a first end to the electrical traces of the printed circuit board and extend substantially perpendicularly from the printed circuit board such that a second end of each of the plurality of elongate, electrically conductive pillars lies in substantially a common plane which is substantially perpendicular to and above said printed circuit board.

5 Claims, 8 Drawing Sheets

METHOD OF FORMING ELECTRICALLY CONDUCTIVE PILLARS

This is a continuation of application Ser. No. 08/108,097, filed Aug. 27, 1993, issued as U.S. Pat. No. 5,570,032, issued Oct. 29, 1997.

FIELD OF THE INVENTION

This invention relates to semiconductor electronics, and more particularly, to efficient testing of integrated circuits prior to shipment by the manufacturer.

Specifically, this invention involves a method and an apparatus for wafer scale burn-in and testing.

BACKGROUND OF THE INVENTION

A number of integrated circuits are typically fabricated at the same time on a common slice of silicon or wafer. This wafer is usually substantially circular with a diameter of around 3 to 6 inches (7.5 to 15 cm). Once the fabrication process is complete, the wafer is then sliced-up into the individual integrated circuit (IC) chips or dice (singular: die) which are later packaged into modules or incorporated into larger systems.

This process of dividing a wafer into its individual dice involves scribing the wafer with grooves, then breaking the wafer along those grooves like pieces of a chocolate bar. Alternatively, the dice are cut from the wafer using a saw such as a laser. Sometimes, the entire dividing process is referred to as "scribing". When the dice are still connected as an integral wafer or separated but closely packed together as if they still were a wafer, the IC's are said to be in the wafer scale of development.

The steps taken to create a finished, packaged integrated circuit are exhaustive. Consequently, the earlier one can discover a faulty device the better. This device can then be thrown out of any further processing, thereby increasing throughput, saving time and money.

Most IC's that are going to fail before a reasonable lifetime, do so at an early stage. Therefore, these units may be screened out by running all the IC's for a time and then testing prior to shipment. This weeding out process can be hastened by elevating the temperature and applying voltages either statically or dynamically to the IC's. This process is called burn-in. In the past, this required placing the packaged IC module into a special oven or autoclave capable of applying the proper burn-in voltages or signals.

Since some IC's are designed or required to operate in a cooled environment, adequate testing may require special cooling apparatus. In the past, this involved placing the module to be tested inside a cooling chamber or employing highly specialized test equipment.

Often times, more than one IC is packaged in a single module called a Multi-Chip Module (MCM). In this case, burn-in and testing can be more difficult due to the greater complexity of the total circuitry. Also, the faulty module may need to be scrapped or repaired, both of which are time consuming. It is advantageous therefore, to burn-in and test IC's prior to packaging. Once this is feasible, as it now is using the invention, a chip fabricator can supply the MCM market with burned-in and tested dice. Since a single wafer contains hundreds or thousands of IC's held together in precise alignment, it would be desirable to take advantage of this situation for burn-in. With a single alignment of the wafer, it would be possible to burn-in and test all the dice in parallel. As with any wafer scale system, the close proximity of the dice to each other allows for greater speed and less power consumption.

Currently, wafer scale testing of IC's involves using a test probe. In a time consuming procedure, the probe must be precisely aligned with each die to be tested, one at a time. Since this testing is done prior to burn-in, the time spent testing a future failing die is wasted time. Currently, the efficiency of a test probe is limited by the number of contact pads it can engage at any one time.

The next logical step in miniaturization for the semiconductor electronics industry involves wafer scale integration. Basically, this means closely packing the dice used in a system so that they have the same density they enjoyed when they were connected as a wafer. The ability to burn-in and test an entire wafer would be invaluable in implementing this scheme effectively. This would also allow testing the circuitry while the dice are inter-connected and operating in concert.

Figure 1:
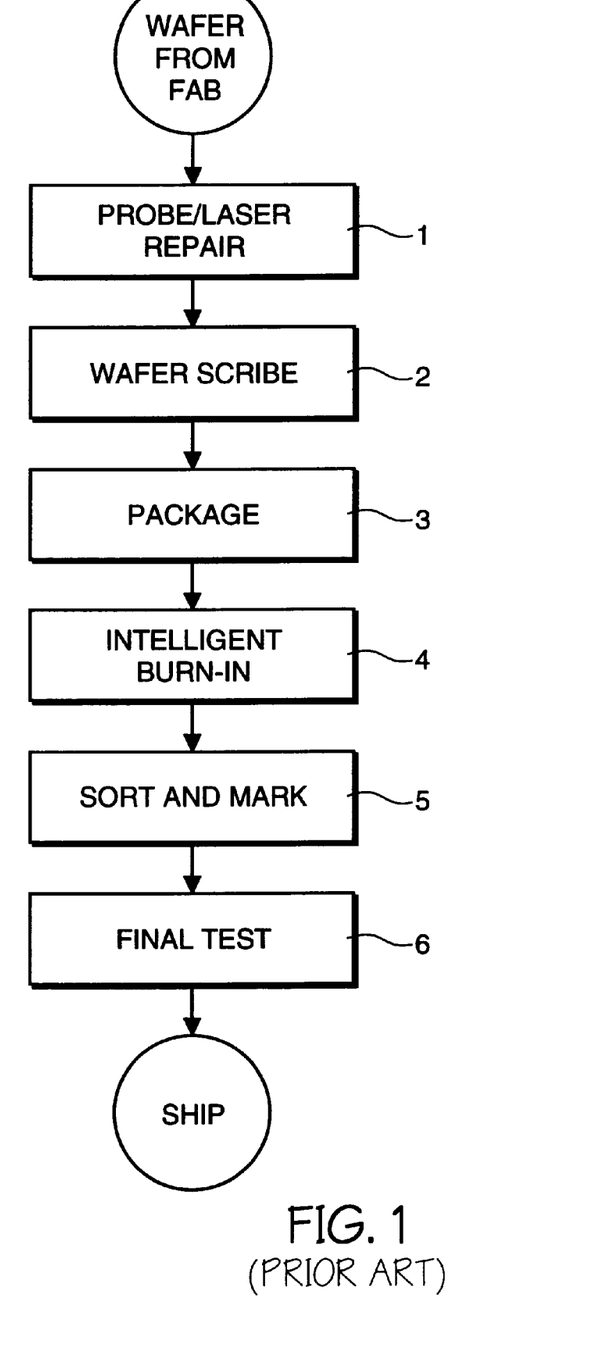
FIG. 1 is a flow diagram of the prior art processing steps in taking a wafer from fabrication to shipment.

FIG. 1 shows the steps involved in processing a fabricated wafer through shipment using the current state of the art process flow, with burn-in occurring after scribing and packaging. This of course applies to the typical manufacturer who ships packaged modules. Shipment can occur at any stage depending on what product or service the manufacturer or company provides.

Typically, the fabricated wafer is first tested 1 using a probe which tests selected portions of the wafer. If any portion is determined to have a repairable fault, repair is implemented by blowing fuses which activate redundant circuitry. Fuses are blown either by laser or electrical means, afterwhich the wafer is retested.

The wafer is then scribed 2, thereby dividing the wafer into individual dice. The dice are attached and wire bonded to a leadframe, wherein each die is packaged 3 by encapsulation into a module. The leads of each module are trimmed, formed and soldered.

The finished modules are then sent to intelligent burn-in 4 and test to eliminate infant mortalities. Intelligent burn-in is different from normal static or dynamic burn-in because it simulates an operating environment and tests the module durning burn-in. The devices are then speed graded to discover their characteristics and tolerances, then categorized as to quality. For example, it may be worthy of military rather than commercial applications.

The modules are then sorted and marked 5, according to their quality and function, then finally tested 6 prior to shipment.

SUMMARY OF THE INVENTION

Accordingly, the present invention provides a vessel which allows burn-in and testing of integrated circuits while those circuits are still at the wafer scale and a method of utilizing wafer scale burn-in and testing to enhance throughput.

In a preferred embodiment, the vessel includes a printed circuit board (PCB) positioned above the wafer serving as an interface between the wafer and outboard equipment which will supply the necessary voltages and signals required during test and burn-in procedures. The PCB has a plurality of electrically conductive pillars protruding from its underside. These pillars are arranged so that tips of the pillars precisely contact the pads of the circuits individual IC's on the wafer when the PCB and wafer are brought together.

Maintaining the PCB/wafer connection requires holding the wafer in a precise, non-permanent orientation with respect to the PCB, and applying the proper force, uniformly distributed across both the PCB and the wafer. This is accomplished by mounting the wafer onto a substantially planar carrier using an adhesive or other means. The carrier is mounted atop a first pressure-plate/heat sink and the PCB is mounted beneath a second pressure plate/heat sink. These two plates are brought precisely together, mating the PCB to the wafer, and providing adequate connection of pillars to pads.

To facilitate burn-in, the wafer is heated by a heating element built into the lower pressure plate/heat sink. To facilitate testing, the wafer is cooled by channels in the lower plate through which gaseous or liquid cooling media can be pumped.

A method of utilizing the vessel according to the present invention is also provided and involves these steps:

choosing and cleaning the vessel;

mounting the wafer into the vessel;

initial testing and laser/electronic repair of the wafer;

performing intelligent burn-in;

scribing, sorting and marking;

packaging dice; and, final testing.

During the evaluation steps of the present method such as initial testing (probing), post repair probing and post burn-in testing, a record is maintained on the performance of each die on the wafer. This record is called a wafer map. Depending on the application and the stage in manufacturing, the map can be used to laser scribe out defective dice, tab certain dice for more extensive testing or repair, and mark dice physically or in software according to their operating characteristics such as speed, leakage, and bit failures. Since the dice are all present and available in the vessel, many of these functions can be accomplished in parallel. The map is again used to sort the dice during extraction from the carrier.

DESCRIPTION OF THE PREFERRED EMBODIMENTS OF THE INVENTION

Figure 2:
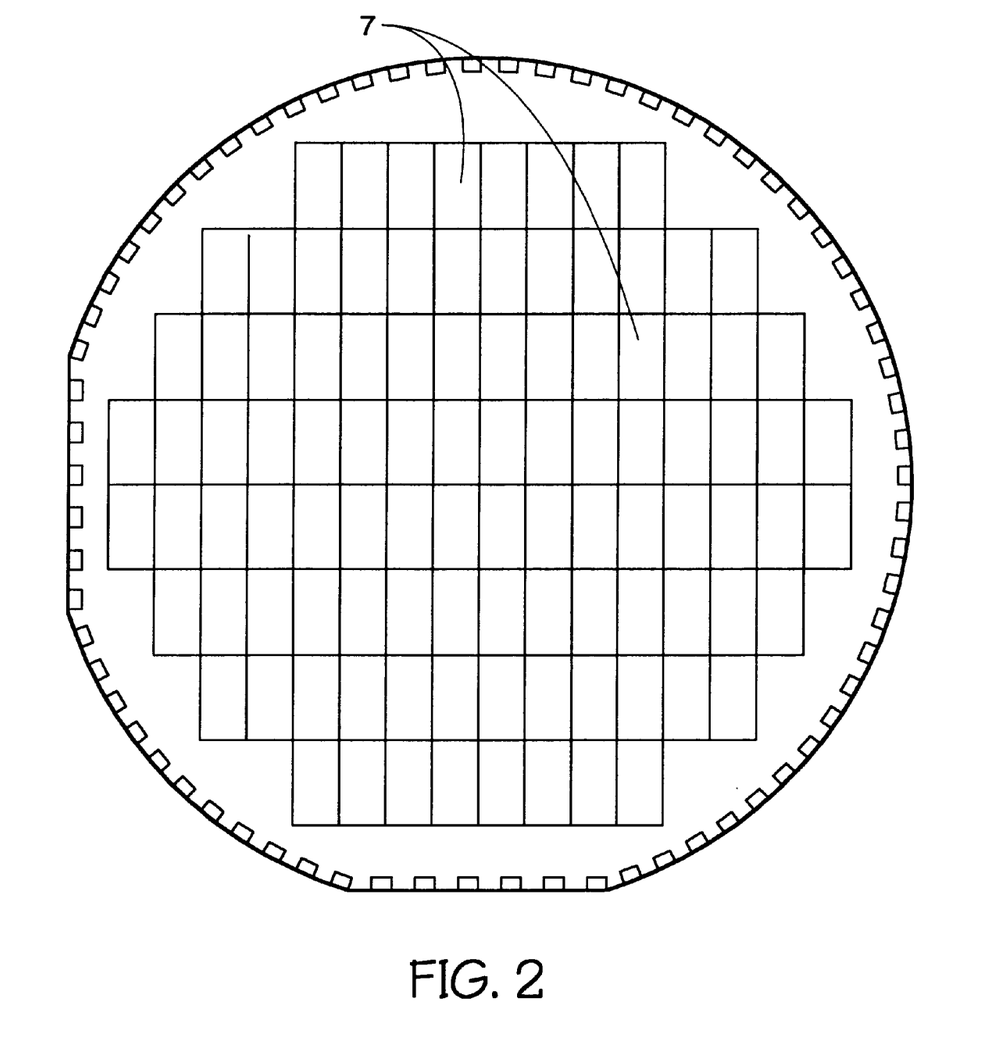
FIG. 2 is a plan view of a typical wafer showing individual die locations.
Figure 3:
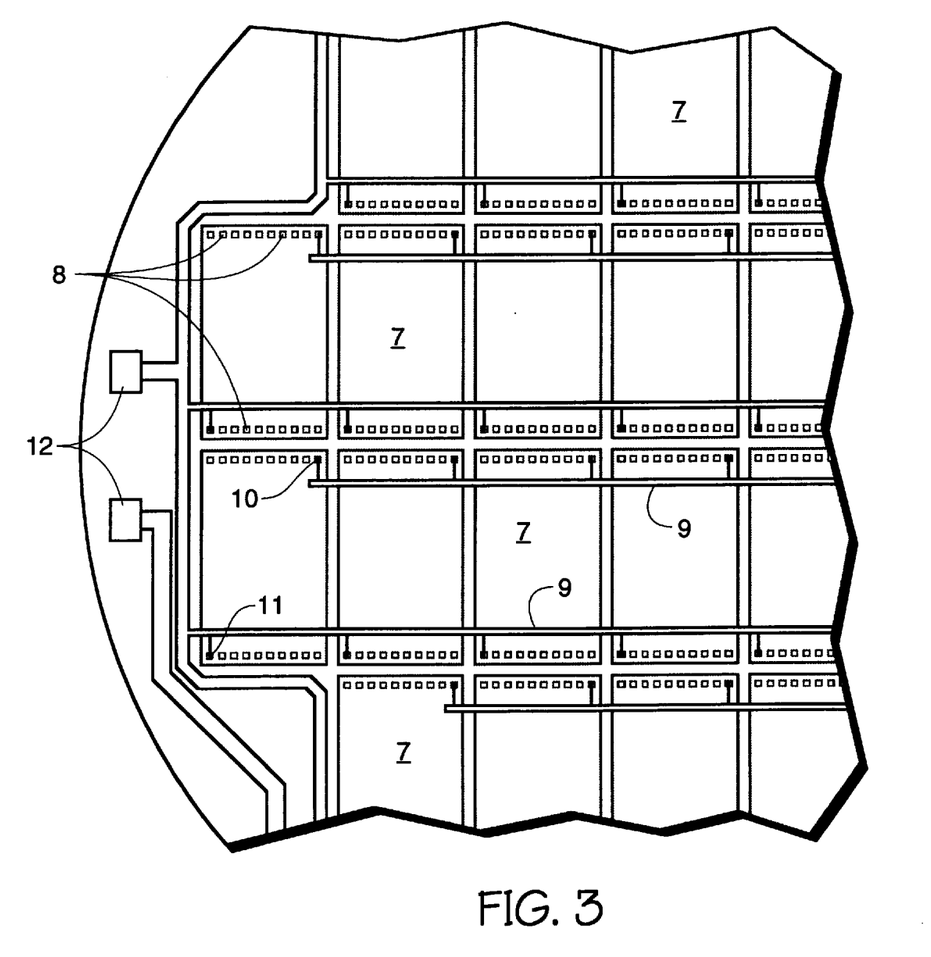
FIG. 3 is a zoomed-in plan view of a typical wafer.

Referring now to the drawing, FIG. 2 shows a typical circular semiconductor wafer 14 after fabrication. The wafer 14 comprises many closely packed integrated circuit chips or dice 7 which will eventually be separated from each other. FIG. 3 shows a blown-up portion of the wafer. Each individual die 7 has a number of contact pads 8 which are the electrical connection points for the circuit on that die 7.

Prior art wafer designs incorporated conductive test lines 9 fabricated onto the wafer 14 itself. These lines connect the ground and power supply ports 10 and 11 on each die 7 to relatively large, common contact pads 12 located around the periphery of the wafer. These large pads 12 can be accessed by relatively imprecise test equipment during the probe and repair step described above in the prior art method for taking the IC's from wafer to shipment. Since the invention will connect directly to the smaller pads 8 on each die 7, the lines 9 and large pads 12 are no longer needed.

Figure 4:
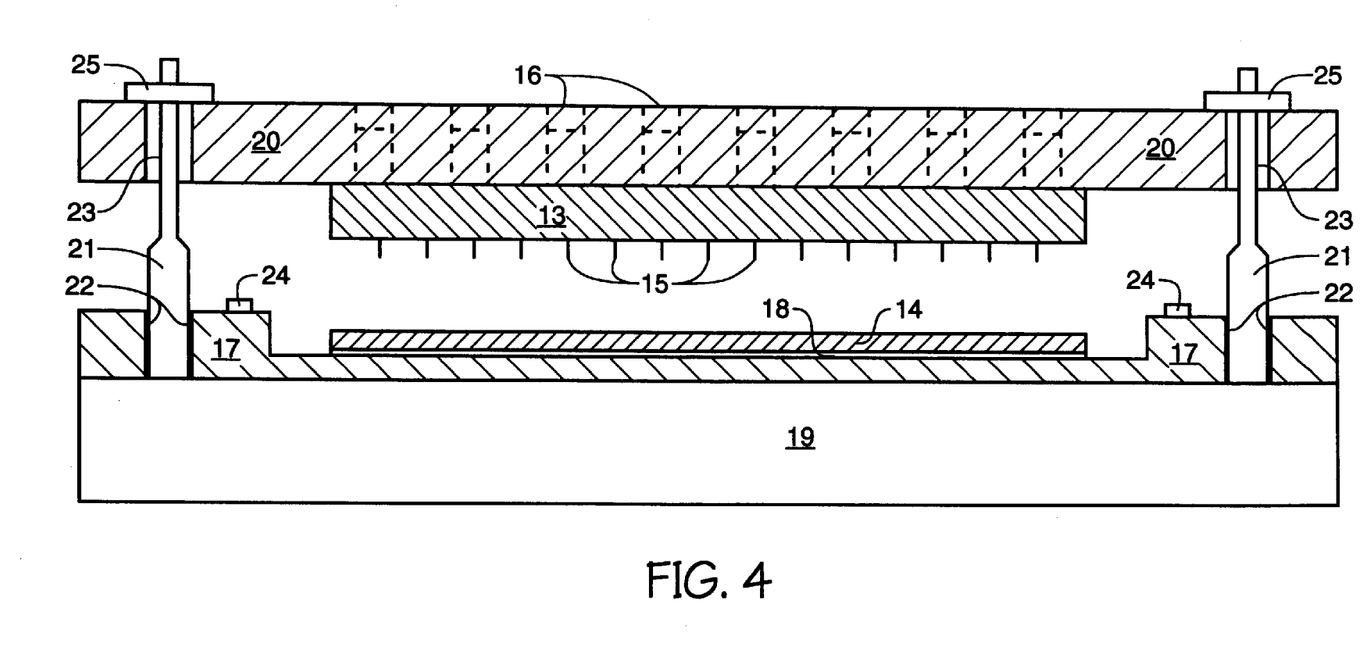
FIG. 4 is a vertical cross-section view of the vessel.

The entire wafer is loaded into a vessel, the cross-section of which is seen in FIG. 4. In general, the vessel serves to bring a printed circuit board (PCB) 13 into precise electrical contact with the dice pads 8 on the wafer 14. Direct contact is made from PCB 13 to wafer 14 through a plurality of conductive pillars 15, one pillar 15 per pad 8. Therefore, each die 7 is independently routed via the pillars 15 and traces 29 (see FIG. 5) of the PCB 13 to connectors 16 which electronically connect the PCB 13 and hence, the wafer 14 to the outside world. Outboard test equipment as is known in the art can be connected to operate the PCB 13 and wafer 14 during test and burn-in. This allows each die 7 to be independently tested at the device's operating speed, and allows all the dice 7 on the entire wafer to be tested in parallel.

The optimum arrangement of the pillars 15 and likewise the pads 8 of a given die type may become an industry standard. Should some other standard be agreed upon, pillar arrangement can be modified to conform to that pad arrangement. It is anticipated that the pillars 15 will be small and precise enough so that a PCB 13 can be built having an overabundance of pillars 15 arranged to engage a number of different standard pad arrangements. The excess pillars 15 which do not contact any pads 8 on a particular die 7 can be deselected in software.

To secure its position, the wafer 14 is attached to the wafer saw carrier frame (carrier) 17 using an adhesive layer 18. The carrier 17 is then mounted to the upper side of a lower plate 19 which provides sturdy, rigid support for the carrier 17 and acts as a heat sink, drawing heat away from the wafer 14 during operation.

The PCB 13 is attached to the underside of an upper pressure plate heat sink 20. The upper plate 20 provides sturdy, rigid support for the PCB while acting as a heat sink as well. When the two plates 19 and 20 are brought together, they provide a uniform compressing force across both the PCB 13 and the wafer 14, thereby maintaining proper contact between them.

The position of the plates 19 and 20 in relation to each other is maintained by the alignment guides 21 which are firmly attached to or integral with the lower plate. The alignment guides 21 restrict lateral movement of the carrier 17 by engaging holes 22 through the carrier 17. They also laterally align the upper plate 20 to the lower plate 19 by slidingly engaging holes 23 in the upper plate.

Vertical movement of the upper plate 20 in the downward direction is restricted by spacers 24 attached to the lower plate 19 that rest up against the exposed underside of the upper plate 20 when the PCB 13 and wafer 14 are in proper contact with each other. Vertical movement in the upward direction is restricted by fasteners 25 attached to the alignment guides 21 above the upper plate 20.

Some of the features of the vessel require more detailed description. First, the PCB 13 can be constructed of polyimide, KEVLAR brand material, KAPTON brand material, or any similar material capable of withstanding burn-in and cold test environments. Also, depending on the application, the PCB 13 may be constructed with multiple power and ground layers.

Figure 5:
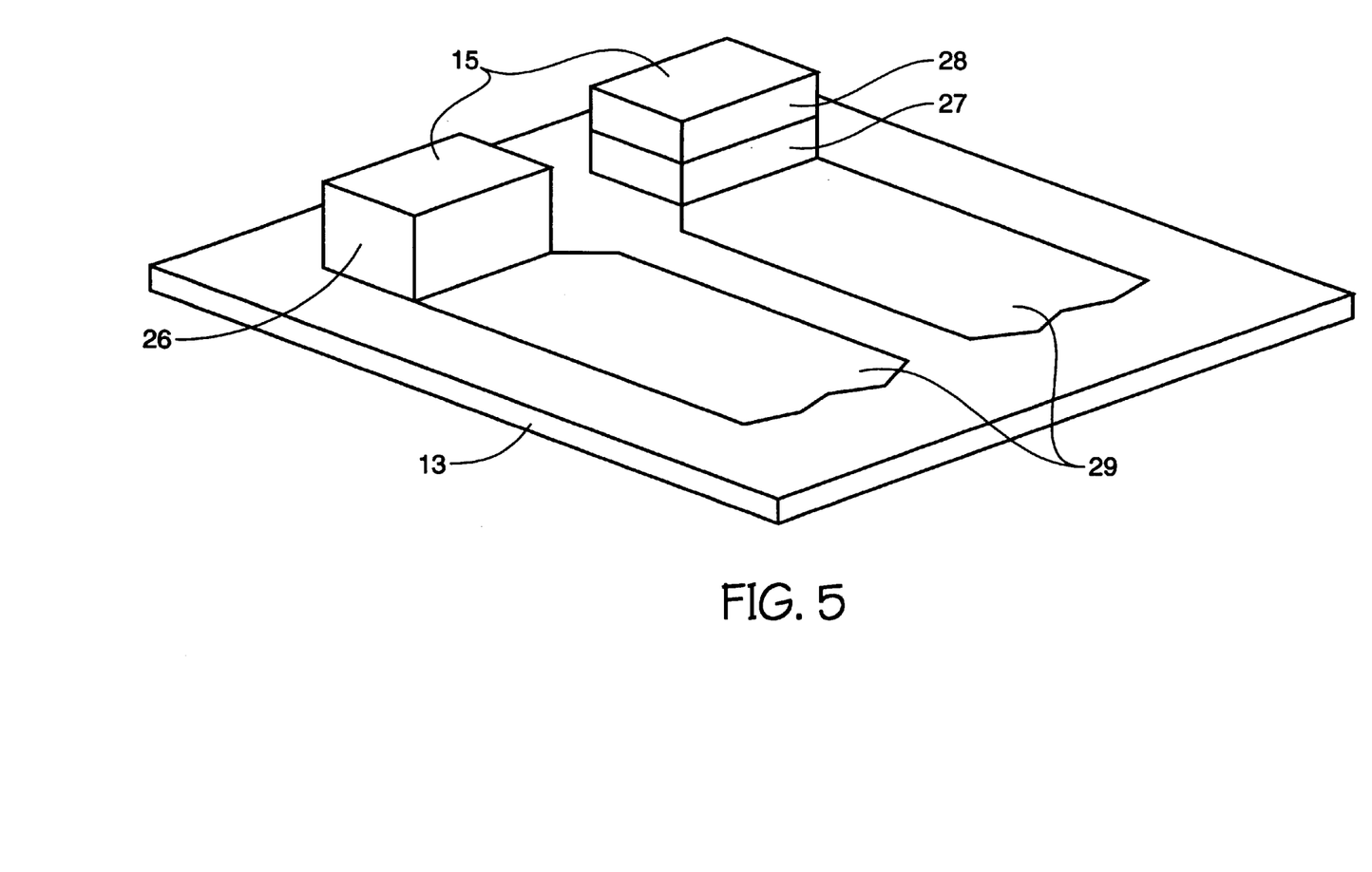
FIG. 5 is an inverted perspective view of a section of the underside of the printed circuit board with pillars extending upward.

FIG. 5 shows the PCB 13 in an inverted orientation with the conductive pillars 15 extending upwardly therefrom. The conductive pillars can be made of conductive polymer/epoxy as depicted by the first pillar 26 or a combination of metal bumping such as solder 27 and conductive polymer/epoxy 28. Also shown are conductive connection lines or traces 29 which are part of the PCB.

Since the pads 8 on the wafer 14 lie substantially within a horizontal plane, the ends of the pillars 15 must be substantially planar to properly engage them. This can be achieved by freezing the pillars 15 to a certain level of rigidity, then milling them down, or by melting the ends off using a mold of the proper height and tolerance. The height may have to be adjusted to allow for thermal expansion of the PCB 13 and wafer 14. Furthermore, additional metal shavings may be placed in the polymer/epoxy before curing, thereby creating a wiping surface to remove metal oxides on the die pads 8 when the PCB 13 and wafer 14 are mated.

The wafer 14 is optically aligned with the carrier 17 and placed on the carrier 17 by mechanical or other such means including various robotics. Since the carrier 17 is already being used to precisely orient the wafer 14 for scribing, the targeting features existing on the carrier 17 may be used to optically align the wafer 14 laterally and rotationally for mating with the PCB 13. The PCB 13 itself contains a targeting feature, referred to as a fiducial as is known in the art, to precisely align it to the upper plate 20. Preferably, the components of the vessel are constructed to such a tolerance that the carrier 17 is already aligned with respect to the vessel.

Figure 6:
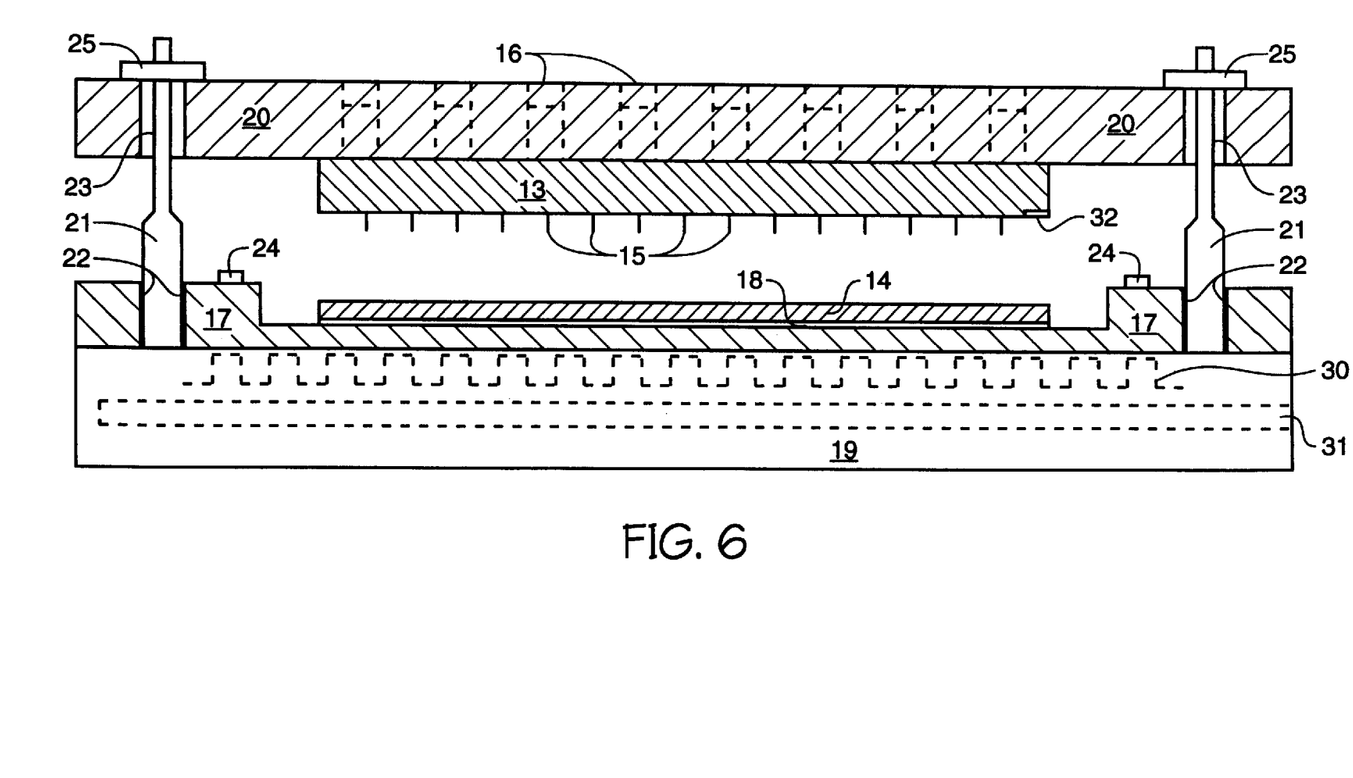
FIG. 6 is a vertical cross-section of the vessel showing heating element and cooling channel built into the lower plate.

FIG. 6 shows the vessel with a heating element 30 incorporated in the lower plate 19, thereby making the vessel a stand alone miniature burn-in oven or autoclave. Cooling means may be realized by boring channels 31 in the lower plate 19 through which gaseous or liquid cooling fluid can pass. External methods of heating and cooling may be used in lieu of, or in addition to these features. A thermal sensor 32 is incorporated into the vessel to monitor the wafer 14 temperature.

Figure 7:
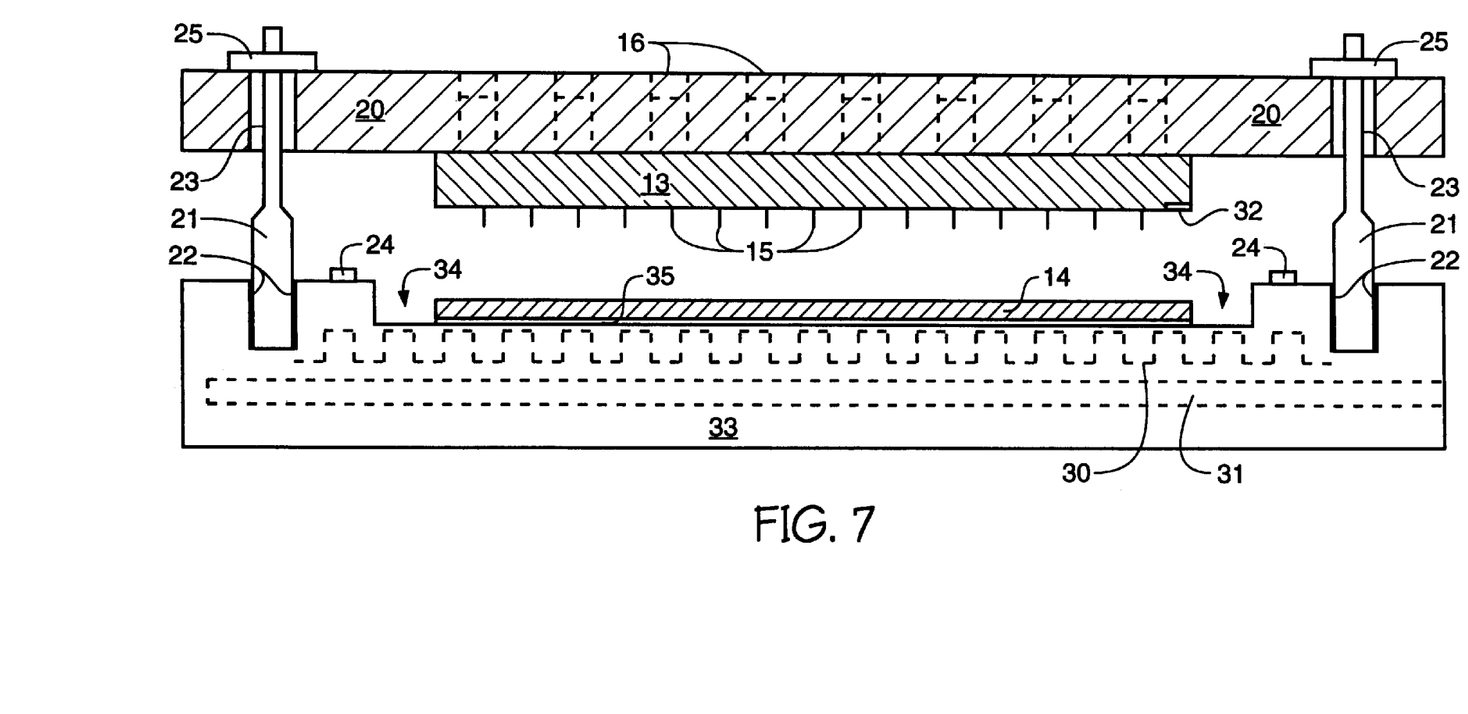
FIG. 7 is a vertical cross-section of the vessel where the wafer is attached directly to the lower plate, without using the wafer saw carrier frame.

FIG. 7 shows an alternative means for accurately aligning the wafer in the vessel by eliminating the wafer carrier 17 and directly placing the wafer 14 on the lower plate 33. Here, the upper surface of the lower plate 33 has a recess 34 sized and dimensioned to hold the wafer 14 and allow for its thermal expansion. This recess 34 may also serve to mechanically align the wafer 14 within the vessel.

The surface of the recess 34 may be coated with a layer 35 of sticky tape or epoxy to provide more stable attachment of the wafer 14. Alternative attachment means, either mechanical or adhesive can be employed, however the attachment needs to remain intact and functional at temperatures in excess of 125 degrees C. and in cold temperatures around −55 degrees C. Also, adhesion should not be so strong as to cause difficulty in later removing scribed dice 7 by vacuum pickup.

The vessel design should allow for removable/replaceable PCB's 13. Depending on the application, type of wafer being worked on or the type of testing being done, different PCB's can be loaded into the vessel. For example, one PCB with reduced connections and controlling logic (microprocessors, multiplexers, etc.) might be used for initial or final probe testing, redundancy programming, pre-passivation testing or any other fabrication or testing requirements. Likewise, a PCB with no logic and several connectors might be used for burn-in. It is also possible to have the complete test electronics included in the PCB and/or vessel.

Figure 8:
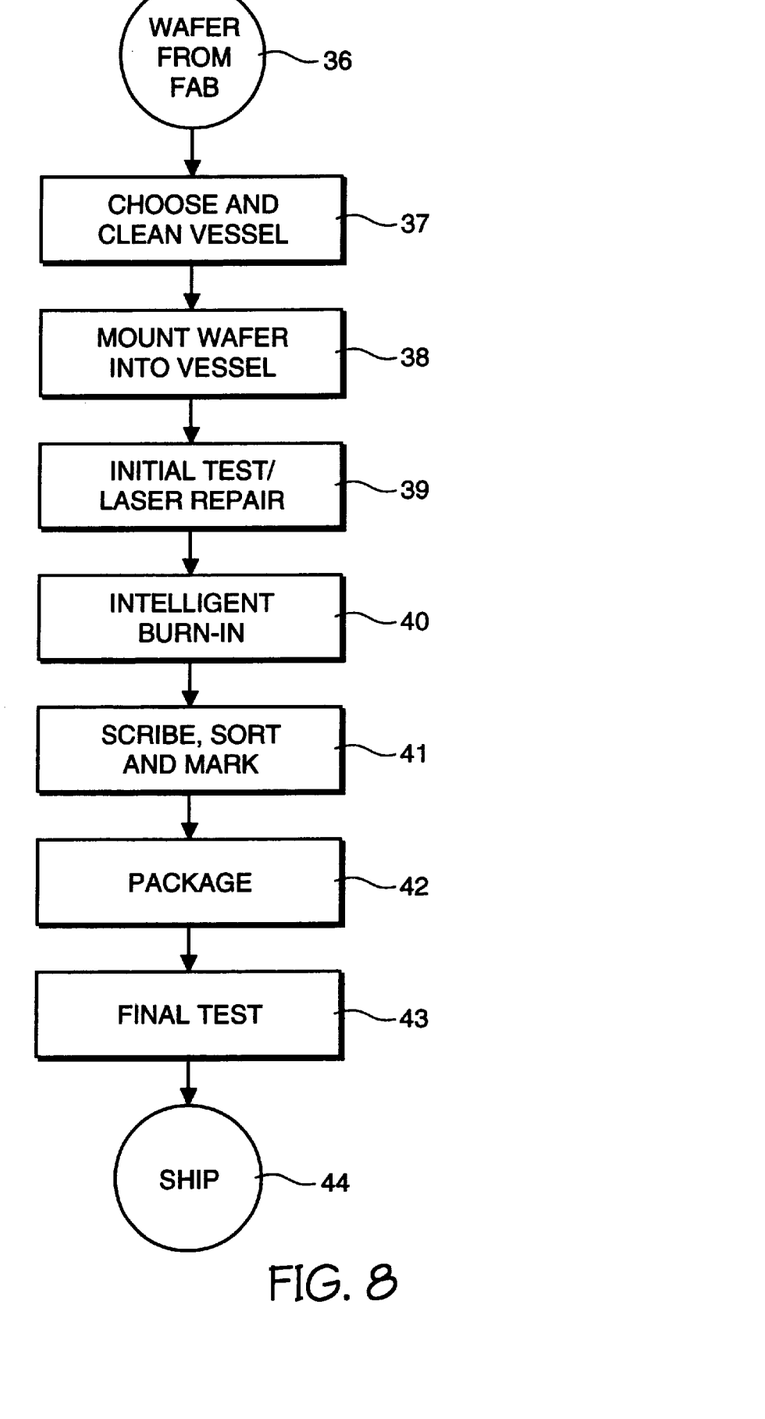
FIG. 8 is a flow diagram of the processing steps in taking a wafer from fabrication to shipment using the invention

The true worth of the vessel is realized and its potential utilized in a new method of wafer scale burn-in and testing. FIG. 8 shows this method of taking a fabricated wafer through to module shipment.

Wafers arrive from fabrication 36 typically in a wafer boat. The wafer serial number is read to determine the device type. A vessel appropriate to the device type is selected and cleaned 37 if necessary to remove any contaminants that accumulated from previous use. An adhesive is then applied to the recess in the vessel's lower plate where the wafer will be placed. The wafer is removed from its boat by vacuum arm and placed onto the lower plate. The upper plate is aligned to the lower, and the plates are brought together, therby mounting the wafer to the vessel 38. The wafer serial number is recorded either optically or electronically along with the vessel serial number and loaded into the test software for development of the wafer map.

The completed vessel is place in a queue leading to initial test 39. The queue may comprise conveyor belts, automated carts or racks that allow transport of the vessel to probe apparatus, whereupon the vessel is mounted within the apparatus and electrically connected. The interfacing circuitry can perform all tests currently accomplished by probe involving wafer repair and parametrics. The vessel can be reopened for laser repair, or remain closed for electrical repair which is done by routing control signals through the existing interface circuitry. Upon completion of repairs, coded information acquired during initial test regarding bit failures, parametrics such as power consumption, pin leakages, speed grade, and other basic funtionality is recorded in the wafer map in software. The vessel is then placed in a queue for burn-in and testing.

The vessel is then mounted and connected to a burn-in and test system which makes use of wafer map information such as device types, defective elements, bits, etc., to accomplish intelligent burn-in and test 40. The system provides the electronic interconnect necessary to test individual devices along with power for the vessel's heating elements and supply for the vessel's cooling channels..Intelligent, environmental stress testing is performed with the tester supplying stimuli and adjusting the vessel temperature. When computerized failure analysis has determined that a sufficient burn-in has been achieved, the vessel is returned to ambient temperature, removed from the system, and placed in the queue for scribing.

The vessel is then mounted and connected to a scribe and singulation system 41. The vessel is opened, the wafer scribed and marked, and the devices removed and placed in sorted bins according to the wafer map information. If the final product is to be packaged 42, the devices can be sent to be attached and wirebonded or tabbed to a lead frame, encapsulated, trimmed and formed, soldered, then finally tested 43 and shipped 44. Otherwise, the bare dice may be sent through the appropriate containment processes to prevent contamination during shipment.

Test results of each vessel are placed in a separate database that monitors vessel performance. The database is analyzed to determine whether the vessel has developed any problems requiring either repair or replacement.

Prior to mating the wafer with the vessel, the wafer may be semi-scribed or scored along the die boundaries. This scribing is not done to the degree where it would jeopardize the mechanical integrity of the wafer and thus the alignment of the wafer pads to the PCB. However, since any scribing is a rigorous and stressful procedure, it does reveal those problems which can occur in the circuits due to full-scribing. Fully-scribed dice, however, that are properly attached to the wafer saw carrier may be tested according to the method herein described. Thus, problems resulting from full-scribing can be detected by subsequent testing provided there is adequate mating of the wafer and PCB.

At any time during the process after a testing step, the vessel may be opened if necessary to allow for separation and removal of some dice, or physical marking.

While the preferred embodiments of the invention have been described, modifications can be made and other embodiments may be devised without departing from the spirit of the invention and the scope of the appended claims.

What is claimed is:

1. A method of forming electrically conductive pillars on a printed circuit board, comprising:

providing a printed circuit board having a plurality of electrical traces; and forming a plurality of elongate, electrically conductive pillars of superimposed layers of solder and conductive polymer on said printed circuit board, said plurality of elongate, electrically conductive pillars having a first end and a second end, said plurality of elongate, electrically conductive pillars extending substantially perpendicularly from said printed circuit board, said plurality of elongate, electrically conductive pillars each connected to at least one of said plurality of electrical traces by said first end and said second end of each of said plurality of elongate, electrically conductive pillars lying in substantially a common plane which is substantially perpendicular to and above said printed circuit board.

2. The method of claim 1, either including freezing said plurality of elongate, electrically conductive pillars and milling said plurality of elongate, electrically conductive pillars to effectuate said first end and said second end of each of said plurality of elongate electrically conductive pillars lying in substantially said common plane.

3. The method of claim 1, further including melting said first end and said second end of each of said plurality of elongate electrically conductive pillars to effectuate said first end and said second end of each of said plurality of elongate electrically conductive pillars lying in substantially said common plane.

4. The method of claim 1, wherein said forming said plurality of elongate, electrically conductive pillars of superimposed layers of solder and conductive polymer includes said conductive polymer comprising a polymer epoxy.

5. The method of claim 1, wherein said forming said plurality of elongate, electrically conductive pillars of superimposed layers of solder and conductive polymer includes said conductive polymer comprising a combination of polymer epoxy and metal shavings.

* * * * *

UNITED STATES PATENT AND TRADEMARK OFFICE
CERTIFICATE OF CORRECTION

PATENT NO. : 6,049,977
DATED : April 18, 2000
INVENTOR(S) : Glen G. Atkins et al.

It is certified that error appears in the above-identified patent and that said Letters Patent is hereby corrected as shown below:

Title page,
Item [63], Related U.S. Application Data, change "Aug. 27, 1993," to
-- Aug. 17, 1993, --.
Item [56], References Cited, U.S. PATENT DOCUMENTS, after "3,969,816" insert an asterisk -- * --; after "4,914,814" insert an asterisk -- * --; after "5,060,370" insert an asterisk -- * --; after "5,099,090" insert an asterisk -- * --; after "5,743,009" insert an asterisk -- * --; after "5,745,986" insert an asterisk -- * --; after "5,745,986  5/1998 Variot et al." skip a line and insert -- *cited by examiner --.

Column 1,
Line 5, change "Aug. 27" to -- Aug. 17 --.

Column 2,
Line 42, change "durning" to -- during --.

Column 3,
Line 55, change "frame." to -- frame; and --.

Column 6,
Line 18, change "therby" to -- thereby --.
Line 22, change "place" to -- placed --.
Line 43, change "channels..Intelligent," to -- channels. Intelligent, --.

Signed and Sealed this

Fourteenth Day of March, 2006

JON W. DUDAS
*Director of the United States Patent and Trademark Office*